United States Patent [19]

Suzuki et al.

[11] Patent Number: 5,195,020
[45] Date of Patent: Mar. 16, 1993

[54] COOLING SYSTEM USED WITH AN ELECTRONIC CIRCUIT DEVICE FOR COOLING CIRCUIT COMPONENTS INCLUDED THEREIN HAVING A THERMALLY CONDUCTIVE COMPOUND LAYER AND METHOD FOR FORMING THE LAYER

[75] Inventors: Masahiro Suzuki, Inagi; Haruhiko Yamamoto, Yokohama; Yoshiaki Udagawa, Tokyo, all of Japan

[73] Assignee: Fujitsu Limited, Kanagawa, Japan

[21] Appl. No.: 785,198

[22] Filed: Nov. 1, 1991

Related U.S. Application Data

[63] Continuation of Ser. No. 535,230, Jun. 8, 1990, abandoned, which is a continuation of Ser. No. 197,258, May 23, 1988, abandoned.

[30] Foreign Application Priority Data

May 25, 1987 [JP] Japan .................. 62-125732
Jun. 23, 1987 [JP] Japan .................. 62-96288[U]

[51] Int. Cl.$^5$ ........................................ H05K 7/20
[52] U.S. Cl. ..................... 361/385; 361/386; 257/714
[58] Field of Search .................. 165/80.4, 185; 174/16.3; 357/81, 82; 361/381, 382, 385, 386, 389

[56] References Cited

U.S. PATENT DOCUMENTS

| | | |
|---|---|---|
| 3,896,544 | 8/1975 | Fosnough . |
| 4,226,281 | 10/1980 | Chu ........................ 361/386 |
| 4,644,385 | 2/1987 | Nakanishi . |
| 4,879,632 | 11/1989 | Yamamoto et al. ........... 361/386 |

FOREIGN PATENT DOCUMENTS

| | | | |
|---|---|---|---|
| 0151068 | 8/1985 | European Pat. Off. | ............ 361/385 |
| 0045052 | 2/1987 | Japan | ............ 357/82 |

OTHER PUBLICATIONS

Thermalloy, Inc., Semiconductor Accessories, "Thermal Compounds, Adhesives, and Mounting Kits".
Dow Corning, Information About Silicone Compounds, "Dow Corning 340 Heat Sink Compound".
American Oil and Supply Co., Technical Data Sheet—Product Bulletin No. No. 200, "PQ Heat Sink Compound".
Patent Abstracts of Japan, vol. 10, No. 275.
IBM Technical Disclosure Bulletin, vol. 29, No. 4, Sep. 1986, pp. 1469–1470, New York, US; "Thermal Grease Module Cap Designs".
IBM Technical Disclosure Bulletin, vol. 20, No. 11A, Apr. 1978, pp. 4391–4392, New York, US; S. E. Greer et al.: "Modified Bellows Conductive Cooling".

*Primary Examiner*—Gregory D. Thompson
*Attorney, Agent, or Firm*—Nikaido, Marmelstein, Murray & Oram

[57] ABSTRACT

A cooling system used with a printed circuit board has at least a solid circuit component thereon. The cooling system comprises a cooling header and cooling modules connected to the cooling header. Each of the cooling modules engage to each of the components. The cooling module has a heat transfer plate connected to one end of a bellows which is connected to the cooling header at the other end. A layer of thermally conductive compound, such as a layer of thermal grease, is interposed between the heat transfer plate and the corresponding circuit component. The thermally conductive layer is initially pressed with a pressure higher than a critical pressure, and thereafter, the pressure is reduced to a working pressure exerted on the circuit component provided by the resilient force of the bellows and the hydraulic pressure of the coolant. The critical pressure is predetermined experimentally or practically. As the result, the thermal contact resistance between the heat transfer plate and the circuit component is favorably reduced and stabilized.

15 Claims, 4 Drawing Sheets

COOLING SYSTEM USED WITH AN ELECTRONIC CIRCUIT DEVICE FOR COOLING CIRCUIT COMPONENTS INCLUDED THEREIN HAVING A THERMALLY CONDUCTIVE COMPOUND LAYER AND METHOD FOR FORMING THE LAYER

This application is a continuation application of Ser. No. 535,230, filed on Jun. 8, 1990, now which is continuation of originally filed application Ser. No. 197,258 filed May 23, 1988.

BACKGROUND OF THE INVENTION

The present invention relates to a cooling system used with a printed circuit board holding a number of solid electronic circuit components, such as integrated circuit (IC) semiconductor devices. More particularly, it relates to a cooling module, included in a cooling system, which is in contact with each of the electronic circuit components through a thermally conductive compound layer. The cooling module cools these components.

Various types of cooling structures have been developed for cooling IC semiconductor devices or large scale IC (LSI) semiconductor devices mounted on a printed circuit board as disclosed, for example, in U.S. Pat. No. 3,993,123 issued to Chue et al., 4,203,129 issued to Oktay et al., 4,254,431 issued to Babuka et al., and 4,323,914 issued to Berndmaier, and in not-examined provisionally published Japanese Patent Applications No. 61-15353 by K. D. Ostergrane et al., No. 60-160149 by Yamamoto et al. and No. 62-109347 by Tajima. In some of these cooling structures, a heat transfer element, such as a heat transfer plate or a heat transfer piston, is placed in direct contact with the circuit components. The heat transfer element is urged to contact a surface of a circuit component by pressure provided from a spring, bellows, hydraulic pressure from coolant, etc., to remove the heat dissipated from the circuit components. The heat transfer elements are exposed either directly or indirectly to a coolant. The heat is transferred to the coolant through the corresponding heat transfer elements which are in contact with the circuit components.

In general, however, a rather high and unstable heat contact resistance interface exists between the heat transfer elements and the circuit components in the above described cooling structure because the actual contacting area therebetween is rather small and unstable due to the roughness of the surfaces which are thermally in contact with each other. In addition, any slight change of the pressure of the spring, bellows, and particularly, the coolant pressure, seriously affects the heat contact resistance, resulting in a large loss of the heat transfer efficiency of the cooling modules. In particular, the use of a spring for urging a heat transfer member into contact with the corresponding circuit component to be cooled, tends to cause mechanical resonant vibration triggered by an external mechanical shock, resulting in variation of the exerting pressure.

In order to overcome the aforesaid disadvantages caused by the prior art cooling structures, various liquid thermal conductive materials such as thermally conductive inert gas, a liquid metal or thermal silicon grease, or a compliant thermal conductive material is adhesively inserted into the interface between the surfaces of the heat transfer element of the cooling module and a circuit component. For example, a thermal conductive inert gas is introduced into the interface by Chu et al., and a low boiling point liquid is utilized to immerse a heat transfer piston and a circuit component by Oktay et al. However, a complicated and costly sealing structure for sealing the gas or the liquid is required for both cooling modules. In addition, the thermal conductivity of the associated inert gas and liquid set the reduction of the relevant thermal contact resistance within an upper limit.

Berndmaier et al and Babuka et al both employ a liquid metal or alloy to fill up a contact interface. Ostergrane discloses using a thermal grease in the interface between the conical surfaces of a piston and a hat, and using a liquid metal layer between the piston and a circuit element. With this structure, a rather thick layer of the thermal grease may be required to maintain the layer on the conical surface of the piston, which causes an undesirable increase in the thermal resistance of the layer. In addition, some types of liquid metals usually have a probability of chemical reaction with the contacting material, which requires various counter measures to prevent the reaction.

Yamamoto et al insert a compliant sheet between a circuit component and a heat transfer plate which is urged toward the circuit component by a bellows to reduce thermal contact resistance across the interface between the component and the heat transfer plate. However, a relatively thick compliant sheet is required in order to realize a desirable perfect thermal contact between the sheet surfaces, the contacting surfaces of the relevant circuit elements and the heat transfer plate by expelling small air voids remaining on the contacting surfaces. As a result, the reduction of the whole thermal contact resistance across the interface is adversely affected.

Tajima provides a cooling structure comprising a cap having a spherical top surface, a stud having a concave spherical bottom surface engageable with the spherical surface of the cap, and a cooling hat. The cap contacts with a circuit element with a small gap therebetween which is filled with thermal grease. The stud is secured to a cooling header. The cap and the hat are in contact with each other through a layer of thermal grease which has a considerable thickness sufficient to protect the circuit element from being subjected to pressure. Tajima discloses nothing about pressure to be exerted on the thermal grease layer.

In these prior art cooling modules, a large effort has been made to reduce the heat transfer resistance across a thermal contact interface utilizing various thermally conductive compound materials. However, the results are not sufficient to maintain a desirably low, stable and reproducible thermal contact resistance.

SUMMARY OF THE INVENTION

The primary object of the present invention is to eliminate the aforementioned drawbacks of the prior art cooling structures, and to provide a cooling system for an electronic circuit, having a high performance cooling structure which can effectively, steadily, and uniformly cool circuit components contained in the circuit. The next object is to provide a stable and a reliable cooling structure having a stabilized and a thermally well-conductive layer of a liquid material in a thermal contact interface between a heat transfer plate and a circuit component.

To achieve the aforesaid objects, according to the present invention, first, an experiment is conducted to define a critical pressure Pc, namely the minimum value of a pressure which is to be initially exerted on a layer of thermally conductive compound located in a thermal contact interface between a heat transfer plate and a circuit component. The relationship between the heat contact resistance across the interface and the pressure exerted thereon, represents hysteresis characteristics. The heat contact resistance decreases as the initially exerted pressure Pi increases before exceeding a pressure, defined as a critical pressure Pc. Thereafter, the heat transfer resistance remains unchanged as the pressure is further increased until a maximum pressure Pm is reached. Then, the pressure Pi is gradually decreased. The heat contact resistance of the thermal contact interface remains at the same value until the initial pressure Pi is reduced to a small value Pa approximately equal to zero pressure. The utilization of the above-described hysteresis characteristics between the pressure exerted on a thermally conductive compound layer and thermal contact resistance is the focal point of the present invention.

In practice, an initial pressure higher than an experimentally defined critical pressure Pc, is exerted on a thermally conductive compound layer which is already disposed in a thermal contact interface using a jig or a hydraulic pressure of the associated coolant. Thus, the previously pressed thermally conductive compound has a favorably low heat contact resistance and is capable of maintaining the value in a stable manner under a low pressure. This phenomenon was found by the inventors by conducting and repeating a number of experiments and practices.

As a result, during the operation of the relevant electronic circuit, a pressure Pa, lower than the initially exerted pressure Pm but higher than zero, is sufficiently exerted on the thermal interface to maintain a small heat contact resistance across the interface, which enables heat removal from the relevant components in a stable and effective manner. Of course, during a period where the electronic circuit is out of operation, the pressure Pa is exerted on the circuit element. Hereinafter, the pressure Pa is referred to as working pressure. With respect to a multi-chip printed circuit board in which a number of components are mounted thereon, pressurizing jigs of two types are disclosed in a first and a second embodiment. The jigs exert an initial pressure Pi on the thermally conductive compound layers. Using hydraulic pressure of the associates coolant, for processing the thermally conductive compound layer, is disclosed in a third embodiment. A device for preventing the thermally conductive compound from flowing off the located interface is disclosed in a fourth embodiment. In all the embodiments, bellows are used as a resilient member for elastically pressing the heat transfer plate toward the corresponding circuit component in combination with a hydraulic pressure of fluid coolant.

The thermally conductive compound is a thermal grease, and preferably a thermal silicon grease. The features and the advantages of the present invention will be apparent from the following description and claims with reference to the drawings where like reference numerals denote like parts.

DESCRIPTION OF THE PREFERRED EMBODIMENTS

Generally, thermal contact resistance across any interface between two surfaces of bodies is a function of a contacting area, the finishing and flatness of a surface, and an applied load between the surfaces. Actually contacting area varies depending on the above-described factors except for the filling material. In most applications, improvement in the surface finish and the flatness is expensive in this field and is not economical. Therefore, a thermally conductive layer is interposed between the surfaces, filling small gaps in the interface area and expelling air micro-voids remaining on the surfaces, to reduce the thermal contact resistance thereacross.

Figure 1:
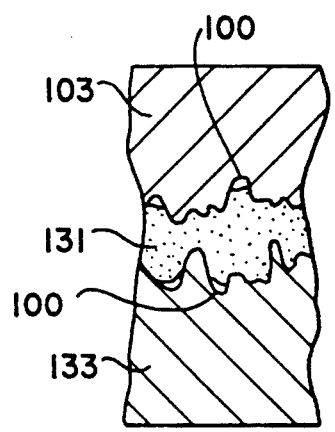
FIG. 1 is a schematic magnified cross-sectional view of a thermal contact interface between the members containing a thermally conductive compound layer therein, for explaining heat transfer thereacross.

FIG. 1 is a magnified cross-sectional view of an interface between surfaces of a heat transfer plate 103 and a circuit component 133 thermally in contact with each other through a layer of thermally conductive compound, which typically is a thermal grease 131. The roughness and irregularities of both surfaces below 1 $\mu$m are inevitable, causing a number of air micro-voids 100 thereon where air tends to be trapped. Thermal contact resistance across the interface can be reduced by eliminating the trapped air by replacing with thermal grease 131, since the thermal conductivity of a silicon oil is several times higher than that of air. Usually, the viscosity of a thermal grease is adjusted so that the thermal grease is semi-flowable, for maintaining a paste-like consistency. The thermal grease 131 contains fillers consisting of fine particles of metal oxides or ceramics, suspending in a carrier fluid such as a silicon oil. Increasing the mutual contact between the fine particles, or between the fine particles and the surfaces of the interface, is used to reduce the thermal contact resistance of the interface filled with the thermally conductive compound layer. According to an accumulated experience of the inventors, the heat contact resistance across a thermal contact interface containing a thermally conductive compound therein has a hysteresis relationship with a pressure exerted thereon as described before. The reason why this phenomenon occurs is not clear but may be caused according to the above-described consideration.

Figure 2:
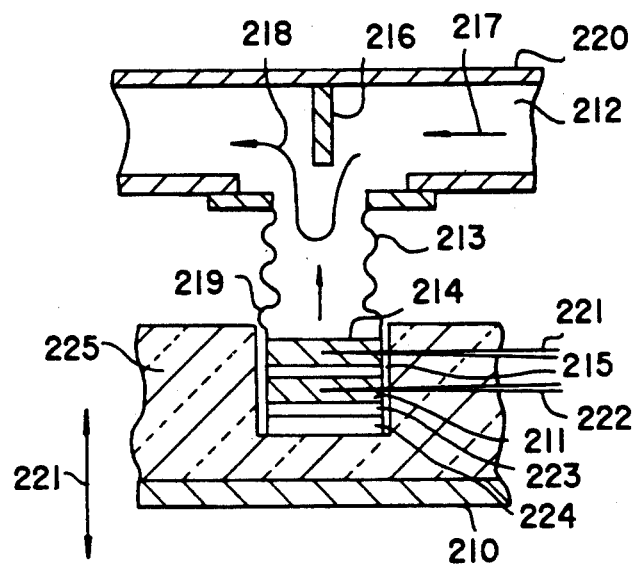
FIG. 2 is a schematic cross-sectional view of an experimental apparatus for studying the relationship between the heat contact resistance across the thermal contact interface of FIG. 1 and a pressure exerted thereon.

FIG. 2 is a schematic cross-sectional view of an experimental apparatus for studying the relationship. In the apparatus, a first copper disk plate 214, a layer of thermal grease 215, a second copper disk plate 211, a heater disk 223, and a load sensor 224 are stacked in the recited order coaxially forming a cylinder block which is surrounded by a thick thermal insulator layer 225 for thermally insulating the bottom side and the cylindrical side of the block. A coolant passage 212, namely a water passage, is disposed in a cooling header 220. The first copper disk plate 214 is connected to one end of a bellows 213, which is water tightly secured to the cooling header 220. The other end of the bellows is operatively connected to the coolant passage 212. The coolant, water, flows through the coolant passage 212 as indicated by an arrow 217. The flow direction is then turned toward the first copper disk 214, as indicated by arrow 218, by means of a deflector 216 disposed inside of the water passage 212 in order to remove heat generated in the heater disk 223. The cooling header 220 is fixed and the cylindrical block is vertically movable by a vertical movement of a table 210 on which the thermal insulator 225 and the cylinder block is placed.

By the structure of the above-described configuration, all the heat generated in the heater disk 223 can be considered to flow in an upward direction as indicated by an arrow 219. The temperature $t_1$ of the first copper disk plate 214 and the temperature $t_2$ of the second copper disk plate 211 are measured by thermo-couples 221 and 222 attached to the disk plates 214 and 211 respectively. Thus the heat contact resistance Rcont of the thermal interface of the thermal grease layer 215 can be easily figured out by measuring the temperatures $t_1$ and $t_2$, and the heating power Q input to the heater disk 223, following a formula:

$$Rcont = (t_2 - t_1)/Q$$

The load pressure P loaded on the thermal grease layer 215 is detected by the load sensor 224, which may be a piezoresistive device such as a silicon pressure transducer readily available in the market. The pressure exerted on the thermal grease 215 is the sum of the hydraulic pressure of the coolant and the resilient pressure of the bellows 213. The hydraulic pressure is changeable using a hydraulic pump and a piping line (both not shown), and the resilient pressure of the bellows 213 can be changed in range by adjusting the vertical position of the base table 210 upwardly or downwardly as indicated by a twin heads arrow 221.

Figure 3:
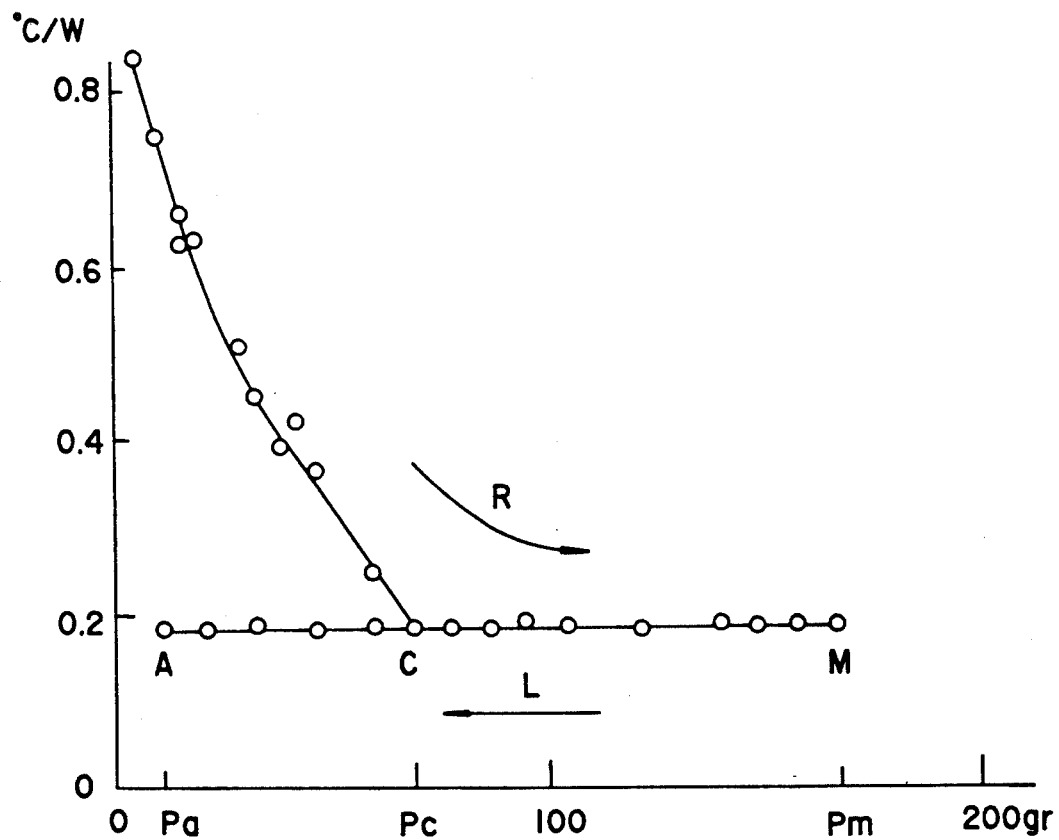
FIG. 3 is a diagram representing the result of an experiment conducted using the apparatus of FIG. 2.

FIG. 3 is a diagram representing an experimental result. The heat contact resistance Rcont is on the ordinate and the load pressure P is on the abscissa. At the beginning of this experiment, the load pressure P is gradually increased from zero to a maximum pressure Pm and kept at the maximum pressure for 3 minutes. Thereafter, the load pressure P is gradually reduced toward zero. Each experimental datum is plotted as indicated by a small circle, initially in the rightward direction indicated by an arrow R, and after reaching a point M, toward the leftward direction indicated by an arrow L. The curve of FIG. 3 represents a hysteresis character. The curve has a turning point C at a load pressure which is referred to as a critical pressure Pc. At a pressure higher than Pc, the heat contact resistance remains unchanged, and is maintained until the load pressure P is increased to Pm. Then, the heat contact resistance decreases from Pm to Pa near zero load pressure. It is confirmed that the heat contact resistance at a load pressure of 10 gram, as indicated by a point A, is still almost the same value as that at a higher load pressure. This hysteresis character is fully utilized in the present invention.

Figure 4:
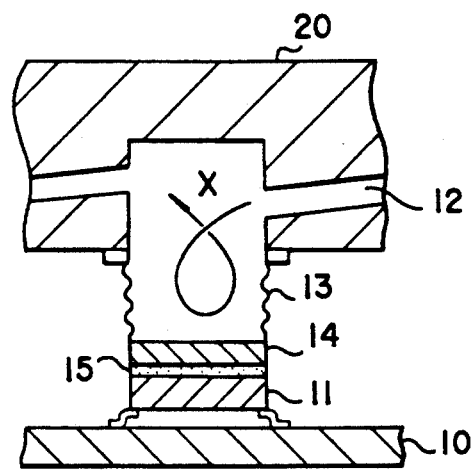
FIG. 4 is a schematic cross-sectional view of a cooling module according to the present invention, illustrating a typical structural configuration thereof.

Basically, the present invention relates to a printed circuit board having a number of circuit components mounted thereon an IC chips, such as a multi-chip printed circuit board. At first, however, a single cooling module applied on a single chip and an associated thermally conductive compound layer, are described to explain the principle of the present invention. FIG. 4 is a schematic cross-sectional view of a cooling module, illustrating its structural configuration. Corresponding to the cooling module, a circuit component 11, such as a semiconductor IC device, is mounted on a printed circuit board 10. A thermally conductive compound layer 15, such as a layer of thermal grease, is interposed between the top surface of the circuit component 11 and a heat transfer plate 14 made of metal having high thermal conductivity, such as copper. The heat transfer plate 14 is connected to a bellows 13 liquid tightly at its one end. At the other end thereof, the bellows 13 is tightly secured to a cooling header 20, which is operatively connected to a coolant passage 12 disposed in the cooling header 20. The coolant, may be a liquid coolant or a gaseous coolant. The coolant flows through the coolant passage 12, contacting the exposed surface of the heat transfer plate 14. The flow of the coolant is directed toward the heat transfer plate 14 guided by the coolant passage 12 as represented by an arrow X such that the heat generated in the circuit component 11 and transferred to the heat transfer plate 14 across the thermally conductive compound layer 15, is effectively removed by the coolant. The thermal conductive compound layer 15 may be coated on the top surface of the circuit component 11 or the bottom surface facing the circuit component 11, of the heat transfer plate 14. As a result, both surfaces come into full contact with each other even when the surfaces are uneven and rough.

The cooling header 20 is fixed. A stacked block, comprising the heat transfer plate 14, thermally conductive compound layer 15 and the circuit component 11, is vertically moved to exert a pressure on the thermally conductive compound layer 15 by vertically moving the printed circuit board 10. With the above-described structure of the cooling module, the thermally conductive compound layer 15 can be pressed before operation in order to enhance and stabilize the thermal conductivity of the layer 15 in the manner as described before with respect to the experiment of results represented in FIG. 3. That is, the layer 15 is pressed by elevating the printed circuit board 10 or by increasing the hydraulic pressure of the coolant, or by combining both operations, to a pressure Pm higher than the critical pressure Pc which is determined by an experiment conducted beforehand. The pressure Pm is maintained for a predetermined time, usually for three minutes. Thereafter, the pressure is decreased from the pressure Pm to a working pressure Pa which may be slightly higher than zero and lower than the critical pressure However, in practice, the working pressure Pa is selected to be a higher value sufficient to absorb an inevitable fluctuation of the relevant hydraulic pressure of the coolant or the elastic pressure of the bellows. Thus the thermally conductive compound layer 15 establishes a compound contact or grease contact between the heat transfer plate 14 and the circuit component 11.

Figure 5A:
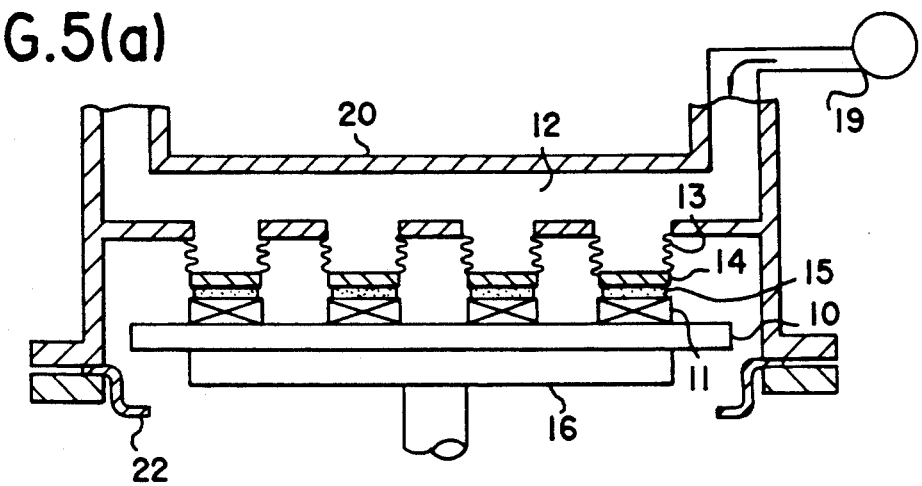
FIG. 5(a)-5(b) are schematic cross-sectional views of a part of the cooling system according to the present invention, illustrating the structural configuration and a method of pressing the thermally conductive compound layer for the first embodiment.
Figure 5B:
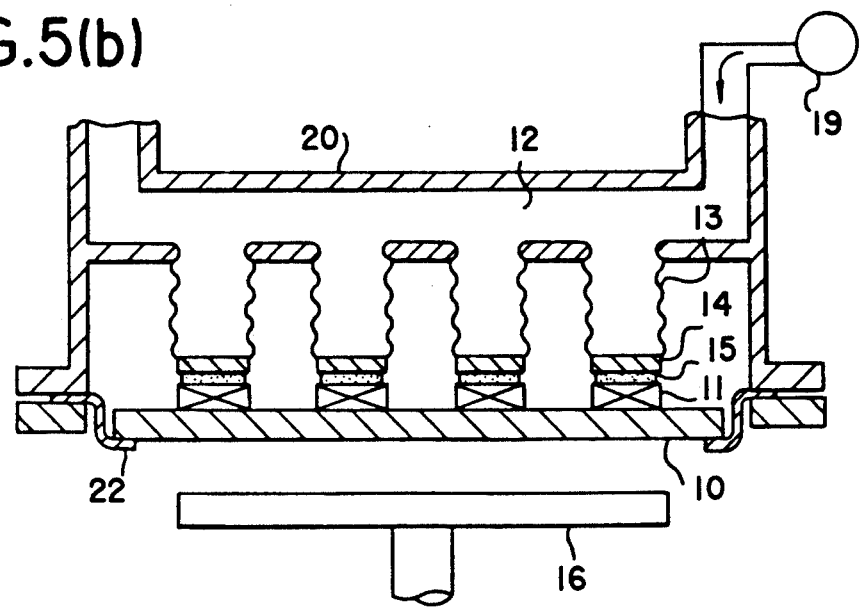

FIGS. 5(a) and 5(b) are a substantially schematic, partial cross-sectional view of a cooling system of a first embodiment of the present invention, illustrating a series of cooling modules for the corresponding circuit components 11 mounted on a printed circuit board 10. The cooling modules are connected to a fixed cooling header 20 through which a coolant passage 12 is disposed. The coolant is pressurized by a hydraulic pump 19 of the cooling system (not wholly shown) of the electronic circuit apparatus. The coolant runs through the coolant passage 12, and removes heat generated in each circuit component 11 through the corresponding cooling module. Each cooling module comprises a bellows 13 fixed to the cooling header 20 and operatively connected to the coolant passage 12 at one end and is connected to a heat transfer plate 14 at the other end. The printed circuit board 10 is supported at its peripheral edge by a flange 22 which is secured to the lower portion of the cooling header 20. The axis of the cooling modules- is arranged vertically to the corresponding circuit components 11. A thermally conductive compound, such as silicon thermal grease available on the market, is coated to form a layer 15 on the top surface of the circuit component 11 or on the bottom surface of the heat transfer plate 14. Then, the printed circuit board 10 is vertically elevated using a movable base plate jig 16, namely a table elevator, and is pressed against the cooling modules. Thus, each circuit component 11 is pressed against the corresponding heat transfer plates 14, exerting a pressure P on each thermally conductive compound layer 15, as shown in FIG. 5(a). The pressure P is increased up to Pm which is higher than the critical pressure Pc which is defined by the experiment conducted beforehand. The pressure Pm is maintained for a time, for instance three minutes and thereafter, the base table 16 is lowered, decreasing the pressure P until the printed circuit board 10 is held again by the flange 22 as shown in FIG. 5(b). The printed circuit board 10 is fixed to the flange 22. In this situation, a working pressure Pa higher than zero is provided on the thermally conductive compound layer 15 As the result, a stable and high heat transfer from the circuit component 11 to the coolant is established, providing the relevant electronic circuit apparatus with high reliability.

Figure 6A:
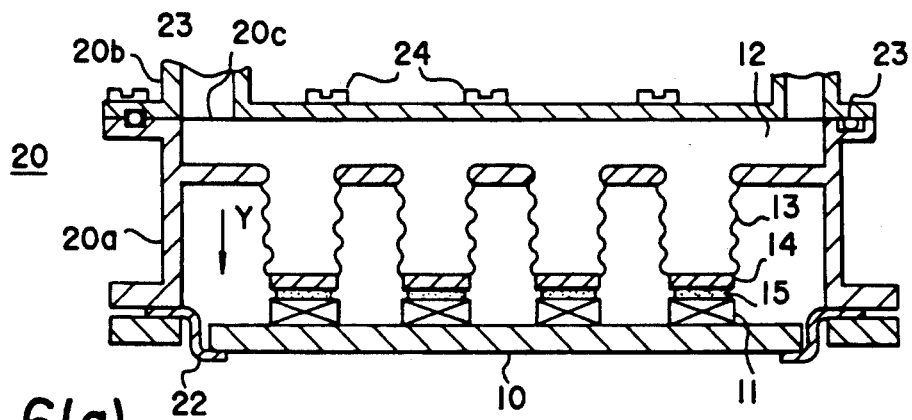
FIGS. 6(a)-6(b) are schematic cross-sectional views of a part of a cooling system according to the present invention illustrating the structural configuration and a method of pressing the thermally conductive compound layer for the second embodiment.
Figure 6B:
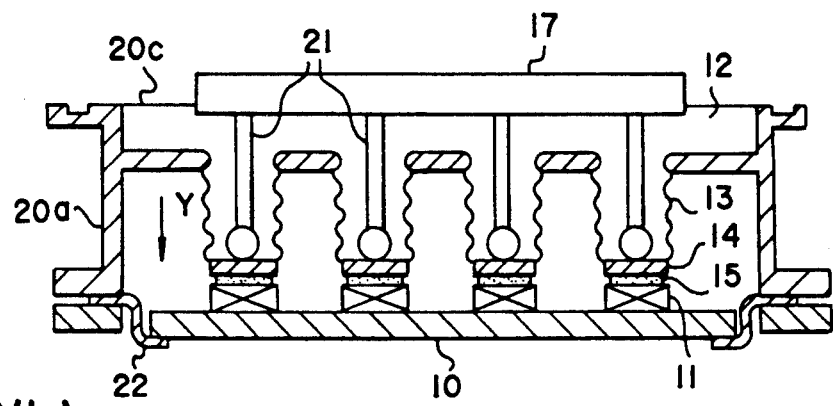

FIGS. 6(a) and 6(b) are a substantially schematic cross-sectional view of a cooling system of a second embodiment according to the present invention, illustrating a series of cooling modules engaging with the corresponding circuit components 11 mounted on a printed circuit board 10. In the second embodiment, the cooling header 20 is separatable into a lower cooling header 20a and an upper cooling header 20b. The lower cooling header 20a has an opening 20c in the upper portion thereof. The relevant heat transfer plates 14 are pushed downwardly as indicated by an arrow Y with a pushing jig 17, pressing each thermally conductive compound layers 15 interposed between the top surface of the circuit components 11 and the heat transfer plates 14, against the corresponding circuit components 11. The pushing jig 17 has a plural number of rods 21 having a ball shaped tip at each end. Each rod 21 is inserted into each bellows 13 through the opening 20c of the lower cooling header 20b, pressing each heat transfer plate 14 connected to the bellows 13 against the circuit components 11. The pushing jig 21 is driven by a mechanical power source (not shown) such that the thermally conductive compound layers 15 are subject to a pressure changing according to the same time schedule as that of the preceding embodiment. Then, the opening 20c of the lower cooling header 20a is closed watertightly by the upper cooling header 20b, namely a header cover, utilizing an "O" ring 23 and screws 24 in a conventional manner. The effect of the thus treated thermally conductive compound layer 15 is the same as that of the first embodiment.

Figure 7:
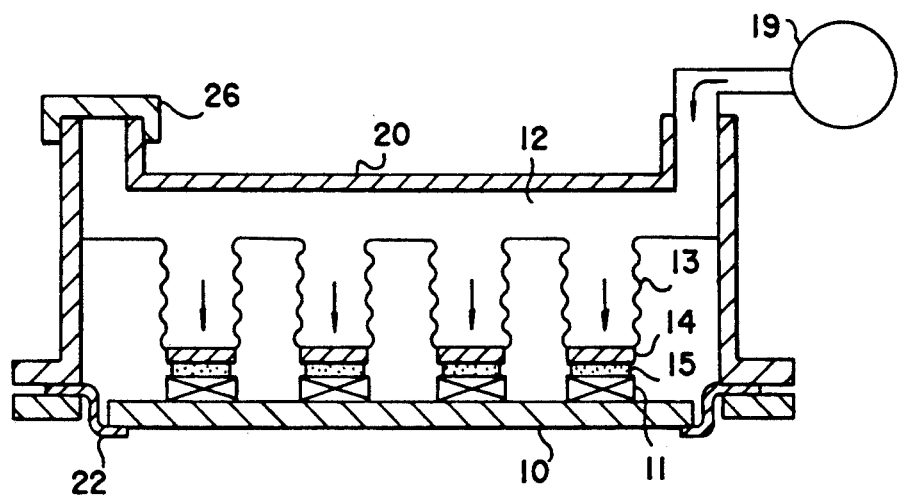
FIG. 7 is a schematic cross-sectional view of a part of cooling system according to the present invention illustrating the structural configuration and a method of pressing the thermally conductive compound layer for the third embodiment.

FIG. 7 is a substantially schematic cross-sectional view of a cooling system of a third embodiment of the present invention. FIG. 7 illustrates a series of cooling modules for the corresponding circuit components 11 mounted on a printed circuit board 10. In the third embodiment, the structural configuration of the cooling system is the same as that of the first embodiment. However, instead of pressing jigs used in the preceding embodiments, hydraulic pressure of coolant is used by controlling the relevant hydraulic pump 19 connected to an opening of a cooling head such that the thermally conductive compound layer 15 can be subject to a varying pressure according to a similar time schedule as employed in the first and second embodiments. The other opening of the cooling header 20 is closed by a stopping cover 26 as shown in the figure, or by using a stop valve (not shown). The output pressure of the pump 19 is controlled by controlling a driving motor (not shown) such that the above described pressuring pattern is achieved. The effect of the cooling modules is the same as the preceding embodiments. Although, the adjustment of the hydraulic pressure by controlling the relevant hydraulic pump is necessary, the initial pressing of the thermally conductive compound layer is easily performed using the method of the third embodiment.

Figure 8:
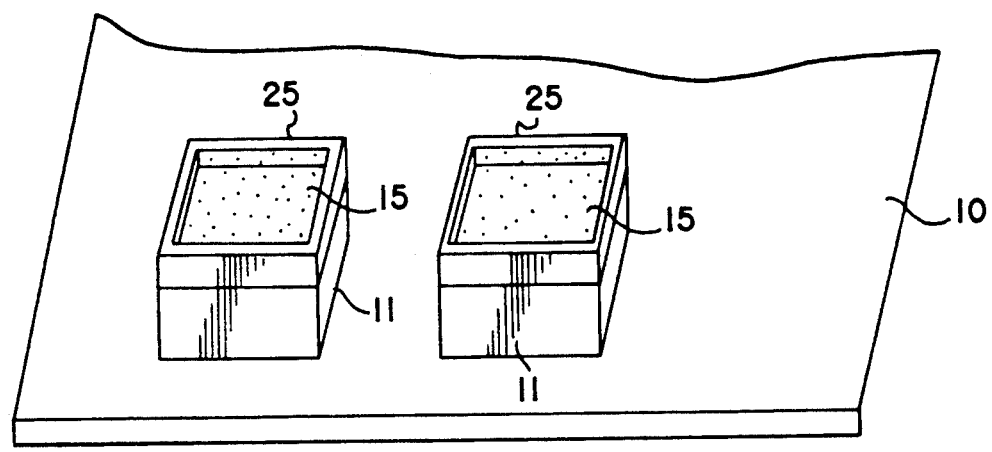
FIG. 8 is a perspective view of circuit component mounted on a printed circuit board, illustrating the structural configuration of a barrier means of a fourth embodiment of the present invention.

FIG. 8 is a perspective view of circuit components 11 mounted on a printed circuit board 10 having square ring-shaped barrier means 25 disposed on the top surface of the circuit components 11, for preventing thermally conductive compound layers 15 from flowing away from the area initially disposed. The barrier means 25 is formed to surround the area, and may be formed as a single piece body with the circuit component 11 on the top surface thereof, or may be formed separately using a material such as ceramic, silicon rubber, etc. and adhesively disposed on the top surface of the circuit component 11. The height of the barrier 25 is selected to be slightly smaller than the thickness of the thermally conductive layer 15 in order to enable the compound layer to be pressed afterwards. The barrier means 25 may be formed on the bottom surface the associated heat transfer plate 14 (see FIGS. 5, 6, and 7).

The many features and advantages of the present invention are apparent from the detailed specification and appended claims, to cover all such features and advantages of the apparatus which fall in the true spirit and scope of the invention. Further, since numerous modifications and changes will readily occur to those skilled in the art, it is not desired to limit the invention to the exact construction illustrated and described. Accordingly, all suitable modifications and equivalents may be considered as falling within the scope and spirit of the invention.

What we claim is:

1. A cooling system used with a printed circuit board having at least one solid circuit component, said cooling system comprising:
   a cooling header having a coolant passage disposed thereinside;
   a heat transfer means, being exposed to a liquid coolant flowing through said coolant passage, for transferring heat from said heat transfer means to said liquid coolant;
   an elastic means, connected to said heat transfer means and said coolant header, for biasing said heat transfer means against said solid circuit component with a working pressure higher than a zero pressure;
   a semi-flowable thermally conductive compound means, disposed between said heat transfer means and said solid circuit component, for establishing a liquid thermal contact between said heat transfer means and said solid circuit component; and
   over-pressure means associated with said cooling header for releasably exerting a pressure on said semi-flowable thermally conductive compound mean prior to operation of said cooling system to reduce and stabilize the thermal contact resistance between said heat transfer means and said solid circuit component.

2. A cooling system according to claim 1, wherein said semi-flowable conductive compound means is a thermal silicon grease.

3. A cooling system according to claim 1, said heat transfer means, said cooling header and said elastic means form a cooling module.

4. A cooling system according to claim 1, wherein said elastic means is a bellows.

5. A cooling system according to claim 1, wherein said heat transfer means is a plate and made of metal having a high thermal conductivity.

6. A cooling system according to claim 1, wherein said overpressure means is a hydraulic pump.

7. A cooling system according to claim 1, further comprising a barrier means disposed on a surface of said solid circuit component, surrounding an area where said semi-flowable thermally conductive compound means is provided.

8. A cooling system according to claim 1, wherein said over-pressure means is a pushing jig with rods.

9. A cooling system according to claim 1, wherein said cooling header is separatable into a lower member, having an opening, and an upper member for liquid tightly closing said opening of said lower member.

10. In a thermally heat conducting apparatus comprising a first member having a first surface, a second member having a second surface, and a semi-flowable thermally conductive compound means interposed between said first surface and said second surface, said second surface facing said first surface, said both surfaces being rough for a thermal contact, and a pressure being exerted such that said first member and said second member are pressed to each other;
   a method for preparing said semi-flowable thermally conductive compound means to reduce and stabilize the thermal contact resistance between said first member and said second member comprising the steps of:
   interposing said semi-flowable thermally conductive compound means between said heat transfer means and said solid circuit component;
   pressing said semi-flowable thermally conductive compound means with a first pressure higher than a predetermined critical pressure at which thermal contact resistance remains unchanged;
   maintaining said first pressure for a predetermined period of time; and
   reducing said first pressure to a second pressure which is a predetermined minimum pressure to maintain said thermal contact resistance.

11. In a cooling system used with a printed circuit board having at least one solid circuit component, said cooling system including a cooling header, a hydraulic pump and a cooling module, said cooling header having a coolant passage disposed thereinside, said hydraulic pump, connected to said coolant passage, for pressurizing a liquid coolant to flow through said coolant passage, and said cooling module disposed corresponding to said solid circuit component, said cooling module, connected to said cooling header, comprising a heat transfer means and an elastic means, at least a part of said heat transfer means is exposed to the flow of said liquid coolant such that heat may be transferred from said heat transfer means to said liquid coolant, said elastic means connected to said heat transfer means and said coolant header for biasing said heat transfer means against said solid circuit component with a pressure higher than zero pressure, and a semi-flowable thermally conductive component means, disposed between said heat transfer means and said solid circuit component, establishing a liquid thermal contact between said heat transfer means and said solid circuit component, a method for preparing said semi-flowable thermally conductive compound means comprising the steps of:
   interposing said semi-flowable thermally conductive compound means between said heat transfer means and said solid circuit component;
   pressing said semi-flowable thermally conductive compound means with a first pressure higher than a predetermined critical pressure at which thermal contact resistance remains unchanged;
   maintaining said first pressure for a predetermined period of time; and
   reducing said first pressure to a second pressure which is a predetermined minimum pressure to maintain said thermal contact resistance.

12. A method for preparing the semi-flowable thermally conductive compound layer according to claim 11, wherein said first pressure is provided to said thermally conductive compound means by pressing said printed circuit board against said cooling module.

13. A method for preparing the semi-flowable thermally conductive compound layer according to claim 12, wherein said printed circuit board is moved toward said cooling module using a table elevator.

14. A method for preparing said semi-flowable thermally conductive compound layer according to claim 11, wherein said cooling header is separatable into a lower member, having an opening, and an upper member for liquid tightly closing said opening of said lower member, and said first pressure is provided to said semi-flowable thermally conductive compound means by mechanically pushing said heat transfer means against said circuit component using a pushing jig which is inserted inside said lower cooling header by removing said upper cooling header.

15. A method for preparing the semi-flowable the thermally conductive compound layer according to claim 11, wherein said first pressure exerted on said semi-flowable thermally conductive compound means is varied by controlling hydraulic pressure of said coolant using said hydraulic pump and a means for stopping the flow of said coolant.

* * * * *